United States Patent
Wu

(10) Patent No.: US 9,589,609 B2
(45) Date of Patent: Mar. 7, 2017

(54) BIT-LINE VOLTAGE BOOSTING METHODS FOR STATIC RAM AND SEMICONDUCTOR DEVICE INCLUDING STATIC RAM

(71) Applicant: Socionext Inc., Yokohama-shi, Kanagawa (JP)

(72) Inventor: Wenhao Wu, Kokubunji (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/839,357

(22) Filed: Aug. 28, 2015

(65) Prior Publication Data
US 2016/0093370 A1 Mar. 31, 2016

(30) Foreign Application Priority Data
Sep. 25, 2014 (JP) .................................. 2014-195612

(51) Int. Cl.
*G11C 7/12* (2006.01)
*G11C 11/419* (2006.01)

(52) U.S. Cl.
CPC .............. *G11C 7/12* (2013.01); *G11C 11/419* (2013.01)

(58) Field of Classification Search
CPC .................................. G11C 7/12; G11C 11/419
See application file for complete search history.

(56) References Cited

U.S. PATENT DOCUMENTS

| | | | | |
|---|---|---|---|---|
| 6,055,655 | A * | 4/2000 | Momohara | G01R 31/31721 257/E21.645 |
| 2004/0252548 | A1 | 12/2004 | Tsukamoto et al. | |
| 2006/0262635 | A1 | 11/2006 | Kanehara | |
| 2009/0161449 | A1 | 6/2009 | Yamagami | |
| 2011/0032779 | A1 | 2/2011 | Aihara et al. | |

FOREIGN PATENT DOCUMENTS

| | | |
|---|---|---|
| JP | 11-317083 A | 11/1999 |
| JP | 2004-303340 A | 10/2004 |
| JP | 2006-323950 A | 11/2006 |
| JP | 2009-151847 A | 7/2009 |
| JP | 2010-257554 A | 11/2010 |

\* cited by examiner

*Primary Examiner* — Richard Elms
*Assistant Examiner* — Ajay Ojha
(74) *Attorney, Agent, or Firm* — Arent Fox LLP

(57) ABSTRACT

A static RAM having a plurality of word lines; a plurality of bit line pairs; a plurality of memory cells provided at intersections of the plurality of bit line pairs and the plurality of word lines; a write driver connected between a high potential power source line, of which potential is higher than a reference potential, and a drive line; a column switch having transistor pairs which connect one of the plurality of bit line pairs, which is selected, to the write driver; and a boost circuit which boosts the drive line of the write driver to a negative potential, which is a potential lower than the reference potential, at a time of writing of the memory cell, where a well of the transistor pairs of the column switch is connected to the drive line.

3 Claims, 5 Drawing Sheets

BIT-LINE VOLTAGE BOOSTING METHODS FOR STATIC RAM AND SEMICONDUCTOR DEVICE INCLUDING STATIC RAM

CROSS-REFERENCE TO RELATED APPLICATION

This application is based upon and claims the benefit of priority of the prior Japanese Patent Application No. 2014-195612, filed on Sep. 25, 2014, the entire contents of which are incorporated herein by reference.

FIELD

The present invention relates to a static RAM (SRAM: Static Random Access Memory) and a semiconductor device including a static RAM.

BACKGROUND

In recent years, as miniaturization of the semiconductor process has advanced, designing an SRAM that has a small area and which operates at low voltage has been progressing. As a result, the stability of a memory cell is reduced. In order to solve this problem, the stability at the time of writing is secured by boosting the potential of a bit line of a bit line pair, whose potential is to be reduced, to a negative (minus) potential at the time of the write operation.

A write driver is generally formed by an inverter connected between a high potential power source line and a reference potential power source line. In order to boost the bit line to a negative potential, the reference potential power source line of the inverter forming the write driver is set as an independent low-side drive line, the low-side drive line is temporarily set to a negative potential at the time of the write operation, and in other cases, the low-side drive line is set to the same potential as that of the reference potential power source line.

In order to enable the above operation, a capacitive element and a boost control transistor are provided. One terminal of the capacitive element is connected to the low-side drive line. A boost signal is applied to the other terminal of the capacitive element. The boost control transistor is connected between the low-side drive line and the reference potential power source line. The boost signal is applied to a gate of the boost control transistor. Normally, the boost signal is at the high level and the boost control transistor turns on, the potential of the low-side drive line becomes a potential VSS of the reference potential power source line, and the capacitive element is charged to the potential difference between the potential of the boost signal and the VSS. At the time of the write operation, if the boost signal changes to the low level, the boost control transistor turns off and the potential of the low-side drive line changes to a negative potential by the charges charged in the capacitive element. The low-side drive line is connected to a bit line, which is driven to the low side, of a plurality of bit line pairs (column) via a transistor, etc., forming an inverter of the write driver, and the bit line which is driven to the low side is driven to a negative potential.

In the SRAM circuit as described above, the potential difference caused by the boosting differs depending on the variations in the operation voltage, the process conditions, etc. For example, in the case where the operation voltage of the boost signal is high, the low-side drive line changes to a large negative potential. In response to this, if the potential of the bit line of the selected bit line pair, which is driven to the low side, also changes to a large negative potential, there occurs a case where a voltage applied to a transistor of the non-selected column switch exceeds a threshold voltage of the transistor and the non-selected column switch turns on, and therefore, there has been a problem that data is written erroneously to the non-selected memory cell.

In order to solve the problem of an over-boost as described above, Patent Document 1 discloses a clamp circuit that clamps the potential of the low-side drive line.

Further, Patent Document 2 discloses a configuration for controlling a potential difference that is boosted by using a variable capacitor as a capacitive element.

RELATED DOCUMENTS

[Patent Document 1] Japanese Laid Open Patent Document No. 2009-151847
[Patent Document 2] Japanese Laid Open Patent Document No. 2010-257554

SUMMARY

According to a first aspect, a static RAM includes: a plurality of word lines; a plurality of bit line pairs; a plurality of memory cells provided at intersections of the plurality of bit line pairs and the plurality of word lines; a write driver connected between a high potential power source line, whose potential is higher than a reference potential, and a drive line; a column switch having transistor pairs which connect one of the plurality of bit line pairs, which is selected, to the write driver; and a boost circuit which boosts the drive line of the write driver to a negative potential, which is a potential lower than the reference potential, at a time of writing of the memory cell, wherein a well of the transistor pairs of the column switch is connected to the drive line.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Before explaining a static RAM (hereinafter, referred to as an SRAM) of the embodiment, a general static RAM that boosts the low-side drive line of a write driver to a negative potential at the time of the write operation is explained.

Figure 1:
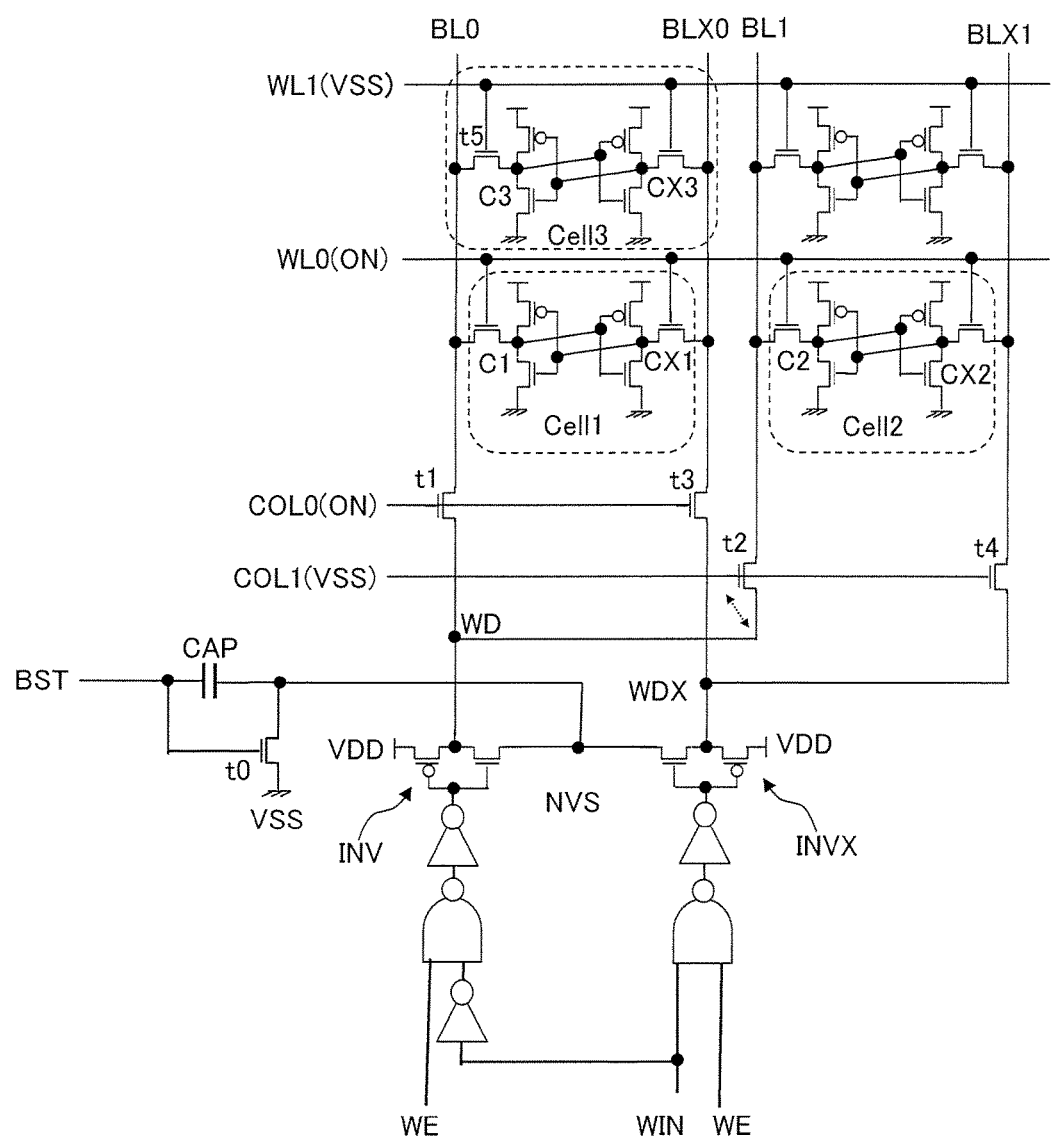
FIG. 1 is a diagram illustrating a configuration of the portions of a memory array, column switches, and a write driver of an SRAM.

FIG. 1 is a diagram illustrating a configuration of the portions of a memory array, column switches, and a write driver of an SRAM. In FIG. 1, a 2×2 memory array is illustrated as an example, but in fact, a large number of memory cells are arranged.

The SRAM has two word lines WL0 and WL1, two bit line pairs, i.e., a pair of bit lines BL0 and BLX0 and a pair of bit lines BL1 and BLX1, and four memory cells Cell1 to Cell4 arranged in correspondence to the intersections of the two word lines and the two bit line pairs. The memory cell has two inverters whose inputs and outputs are connected alternately and two transfer transistors that connect the connection nodes of the inverters to the bit line pairs.

The write driver has a first inverter INV that drives one of the bit line pair, i.e., BL0, and one of the other bit line pair, i.e., BL1, and a second inverter INVX that drives the other of the bit line pair, i.e., BLX0, and the other of the other bit line pair, i.e., BLX1. The first and second inverters are connected between a high potential power source line VDD and a drive power source line NVS. The potential of the high potential power source line VDD is represented by VDD, the potential of the reference potential power source line VSS, to be described later, is represented by VSS, and the potential of the drive power source line NVS is represented by NVS.

In the first and second inverters, when a write enable signal WE is at the low (L) level, the PNMOS transistor turns on and turns write signal lines WD and WDX to the high (H) level. When the write enable signal WE is at the H level, in accordance with write data WIN, one of the transistors of the first and second inverters turns on and the other turns off. For example, when the WIN is at the L level, in the second inverter, the PMOS transistor turns on and the NMOS transistor turns off, and in the first inverter, the PMOS transistor turns off and the NMOS transistor turns on. Due to this, the WDX turns to the H level (VDD) and the WD turns to the L level (NVS). When the WIN is at the H level, in the second inverter, the PMOS transistor turns off and the NMOS transistor turns on, and in the first inverter, the PMOS transistor turns on and the NMOS transistor turns off. Due to this, the WDX turns to the L level (NVS) and the WD turns to the H level (VDD).

One of the bit line pair, i.e., BL0, and one of the other bit line pair, i.e., BL1, are connected to the write signal line WD via column switches t1 and t2, respectively, and the other of the bit line pair, i.e., BLX0, and the other of the other bit line pair, i.e., BLX1, are connected to the write signal line WDX via column switches t3 and t4, respectively. To the gates of the column switches t1 and t3, a column selection signal COL0 is applied, and to the gates of the column switches t2 and t4, a column selection signal COL1 is applied.

The configuration of the SRAM is widely known, and therefore, explanation is omitted.

In recent years, there is a tendency for the operation voltage of the SRAM to become lower and the stability of the operation to be improved by boosting the potential of the bit line that is driven to the low side to a negative potential at the time of the write operation. In the circuit in FIG. 1, the WD and WDX turn to the NVS at the time of the L level, but the NVS is turned to a negative potential lower than the VSS at the time of the write operation. Due to this, a capacitive element CAP one terminal of which is connected to the NVS, and to the other terminal of which, a boost signal BST is applied, and an NMOS transistor (boost control transistor) t0 that is connected between the NVS and VSS, and to the gate of which, the boost signal BST is applied are provided.

At the normal time, the boost signal BST is at the high level, the t0 turns on, the potential of the NVS and that of the VSS become the same, and the capacitive element CAP is changed to the potential difference between the boost signal BST and VSS. At the time of the write operation, if the boost signal changes to the low level (e.g., VSS), the t0 turns off and by the voltage charged across the capacitive element CAP, the potential of the NVS changes to a negative potential.

As described above, the NVS is connected to one of the WD and WDX, and one of the WD and WDX is connected to one of the bit line pair, respectively, which is selected, via the selected column switches. Due to this, one bit line of the selected bit line pair, which is driven to the low side, changes to a negative potential, and the negative potential is applied to the memory cell via the transfer gate of the selected memory cell and it is made possible to perform writing stably.

Figure 2:
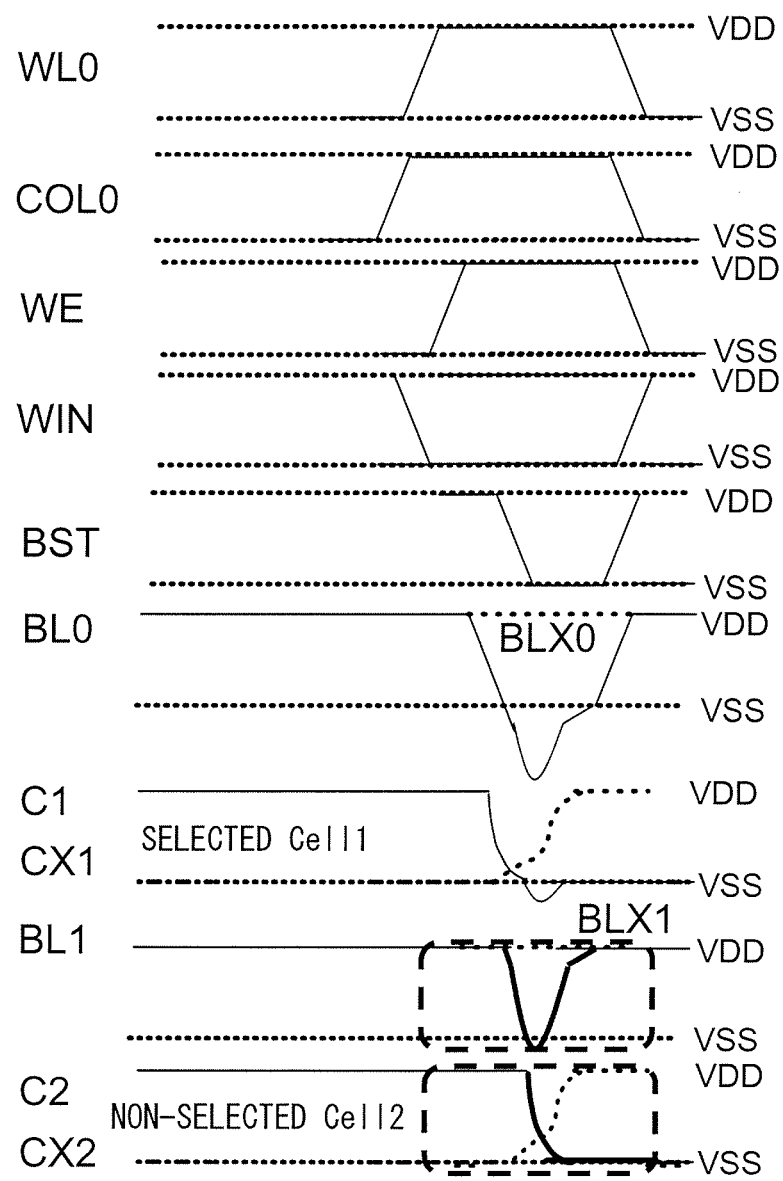
FIG. 2 is a time chart illustrating the write operation of the SRAM in FIG. 1.

FIG. 2 is a time chart illustrating the write operation of the SRAM in FIG. 1.

An example in which the WL0 turns on, the COL0 turns on, the Cell1 is accessed, and WIN=L is written as illustrated in FIG. 1 is illustrated.

As illustrated in FIG. 2, the WIN changes to L, the COL0 and WL0 change to H, and the BL0 changes to L. Further, when the BL0 begins to change to L, the BST changes from H to L, and the boost functions and the BL0 changes to a negative potential. At this time, the BLX0 maintains H.

A node C1 of the Cell1 changes to L in accordance with the change of the BL0 and further changes to a negative potential. Another node CX1 of the Cell1 changes to H in accordance with the change of BLX0. Due to this, L is written to the Cell1.

At this time, as illustrated in FIG. 1, a transfer gate t5 of the Cell3 turns off because the WL1 is at L and the column switches t2 and t4 are off because the COL1 is at L.

When the WD changes to a negative potential, there occurs a case where the potential difference between the COL 1 at the L level and the WD exceeds the threshold voltage of the t2. Due to this, the t2 turns on, the non-selected column BL1 changes to WD (L) and BLX1 changes to VDD (H). The transfer gate t2 of the Cell2 has turned on since WL0 is at the H level, and an erroneous write in which data is written erroneously to the non-selected cell Cell2 of the non-selected column occurs. FIG. 2 illustrates a case in which although a node C2 is at the H level and CX2 is at the L level in the Cell2, the C2 changes to the L and the CX2 changes to H.

As described above, in the SRAM, the low-side drive line is boosted to a negative potential in order to secure the stability at the time of writing. However, data may be erroneously written since an over-boost occurs depending on the manufacturing variations and a transistor of the non-selected column switch turns on.

In the embodiment explained below, the SRAM that prevents an erroneous write by means of a simple circuit is disclosed. For example, a semiconductor device in the present embodiment is an integrated circuit including an SRAM and a processing circuit carrying out predetermined processes based on the data stored in the SRAM.

Figure 3:
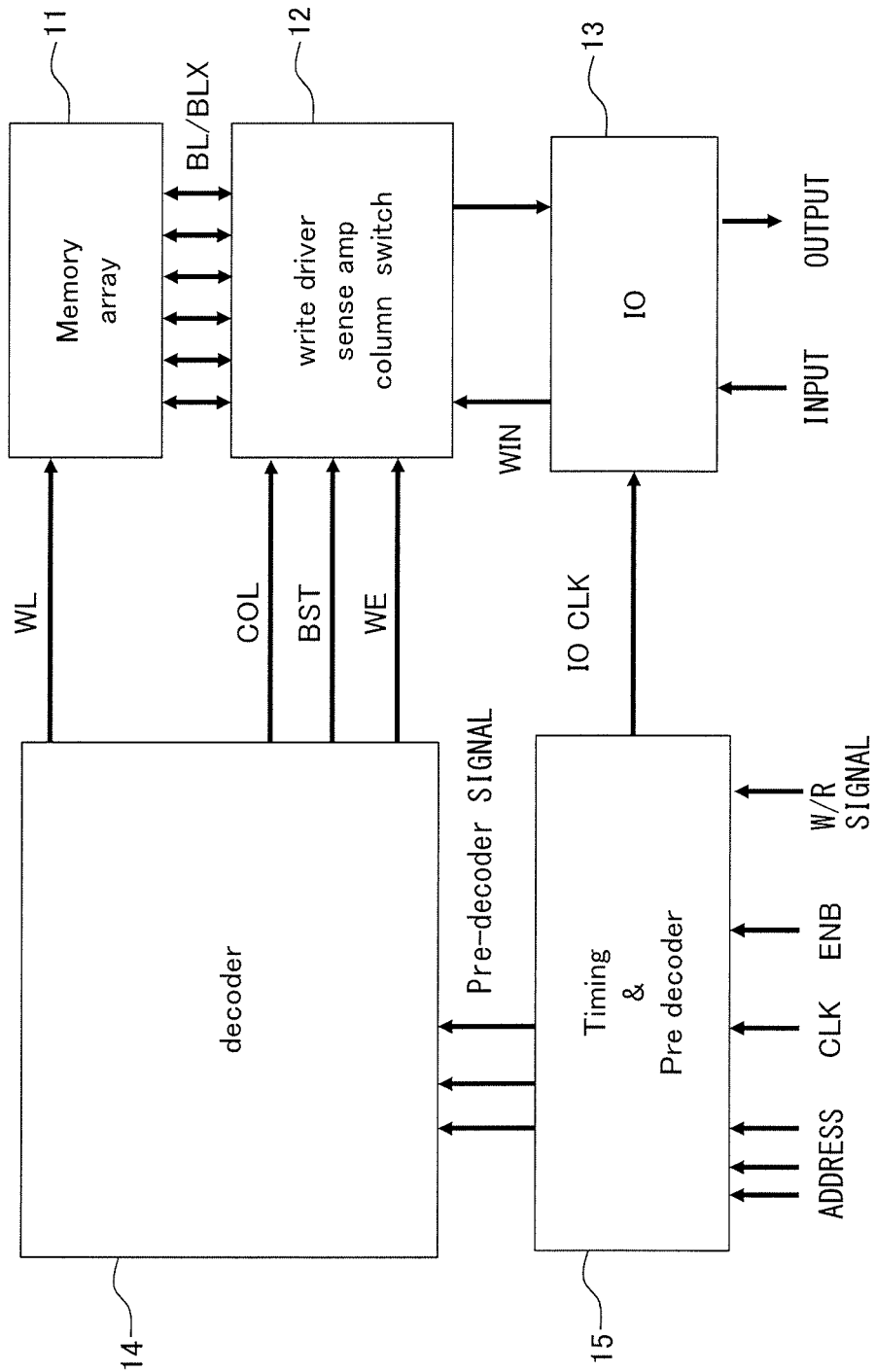
FIG. 3 is a diagram illustrating the general configuration of the SRAM of the embodiment.

FIG. 3 is a diagram illustrating the general configuration of the SRAM of the embodiment.

The SRAM has a memory array 11, a portion 12 including a write driver, a sense amplifier, and a column switch, an input/output unit 13, a decoder 14, and a timing and pre-decoder unit (timing & pre-decoder) 15. The memory array 11 includes a plurality of word lines, a plurality of bit line pairs, and a plurality of memory cells arranged in correspondence to the intersections of the plurality of word lines and the plurality of bit line pairs. The input/output unit (10)

13 receives write data from the outside and generates the WIN, and generates read data from an output of the sense amplifier and outputs the read data to the outside. The decoder 14 decodes a pre-coded address signal and generates a word line selection signal WL, decodes a pre-coded address signal and generates a column selection signal, and further, generates the write enable signal WE, the boost signal BST, etc. The timing and pre-decoder unit 15 performs total timing control and at the same times, pre-decodes an address signal.

The general configuration of the SRAM in FIG. 3 is widely known, and therefore, explanation is omitted.

Figure 4:
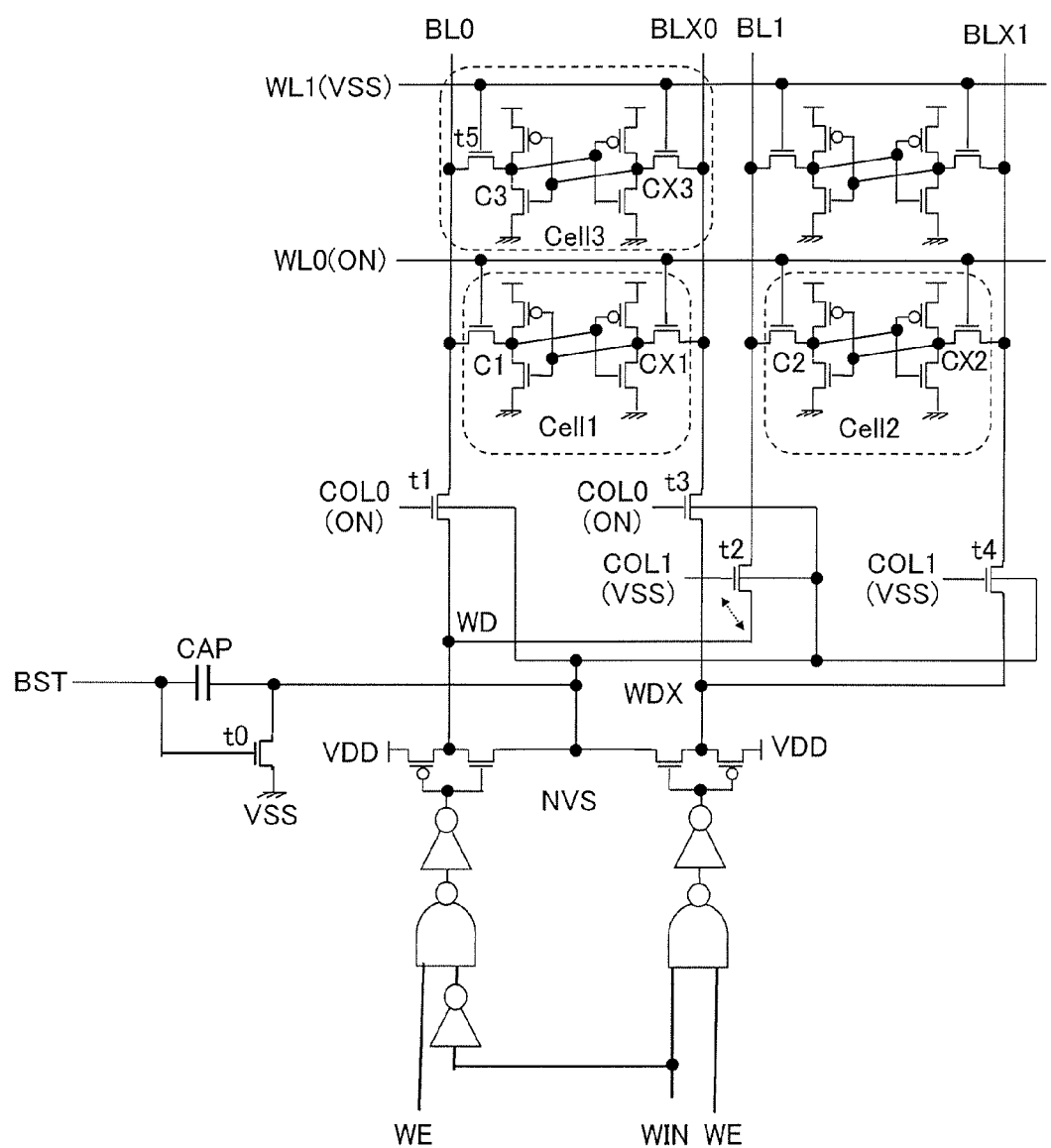
FIG. 4 is a diagram illustrating a configuration of the portions of a memory array, column switches, and a write driver of an SRAM of an embodiment.

FIG. 4 is a diagram illustrating a configuration of the portions of a memory array, column switches, and a write driver of an SRAM of the embodiment. In FIG. 4, a 2×2 memory array is illustrated as an example, as in FIG. 1, but in fact, a number of memory cells are arranged.

The SRAM of the embodiment has a configuration similar to that of the SRAM in FIG. 1. However, it is different that VSS is applied to a well on which the column switch t1-t4 in a same way as other NMOS transistors in FIG. 1 but a boosted voltage NVS is applied thereto in the embodiment. Due to this, NMOS transistors forming the column switches t1-t4 are formed on an independent well (or independent wells) which is separated from those on which other NMOS transistors (for example, NMOS transistors forming word line drivers) are formed. NVS is applied to the well on which the NMOS transistors forming the column switches t1-t4 are formed, and VSS is applied to wells on which other NMOS transistors are formed.

In the SRAM of the embodiment, since NVS is applied to the well of the NMOS transistors of the column switches t1-t4, the more NVS is over-boosted to the negative potential, the stronger the reverse voltages of the NMOS transistors of t1-t4 become, and a threshold voltage becomes larger. Accordingly, although the over-boosts occur, non-selected column switch t2 and t4 do not turn on. Due to this, it is possible to prevent an erroneous write to the Cell2.

A specific example of the voltages applied to respective portions is explained.

For example, in the specific example, the SRAM is designed so that the threshold value of the transistors is about 300 mV, VDD=0.6V and NVS is boosted to −100 mV. In this example, if the SRAM operates at VDD=1.2V, there occurs a case where NVS is boosted to −400 mV. Due to this, the transistors t2 and t4 of the non-selected column switch turn on since voltage differences in the transistors exceed the threshold voltage. Accordingly, an erroneous write of the non-selected cell occurs.

In contrast to this, in the SRAM of the embodiment, the transistors of the column switch are formed on an independent well which is separated from wells on which other transistors are formed. VSS is applied to the well on which other transistors are formed, but the boosted voltage NVS is applied to the well on which the transistors of the column switch are formed. Because of this, when VDD is 1.2V, the reverse bias of the transistors of the non-selected column switch become deeper, the threshold voltage of the transistors changes from 300 mV to 450 mV which is larger than an absolute value of NVS (−400 mV). Accordingly, it is possible to prevent an erroneous write to the non-selected cells.

Figure 5:
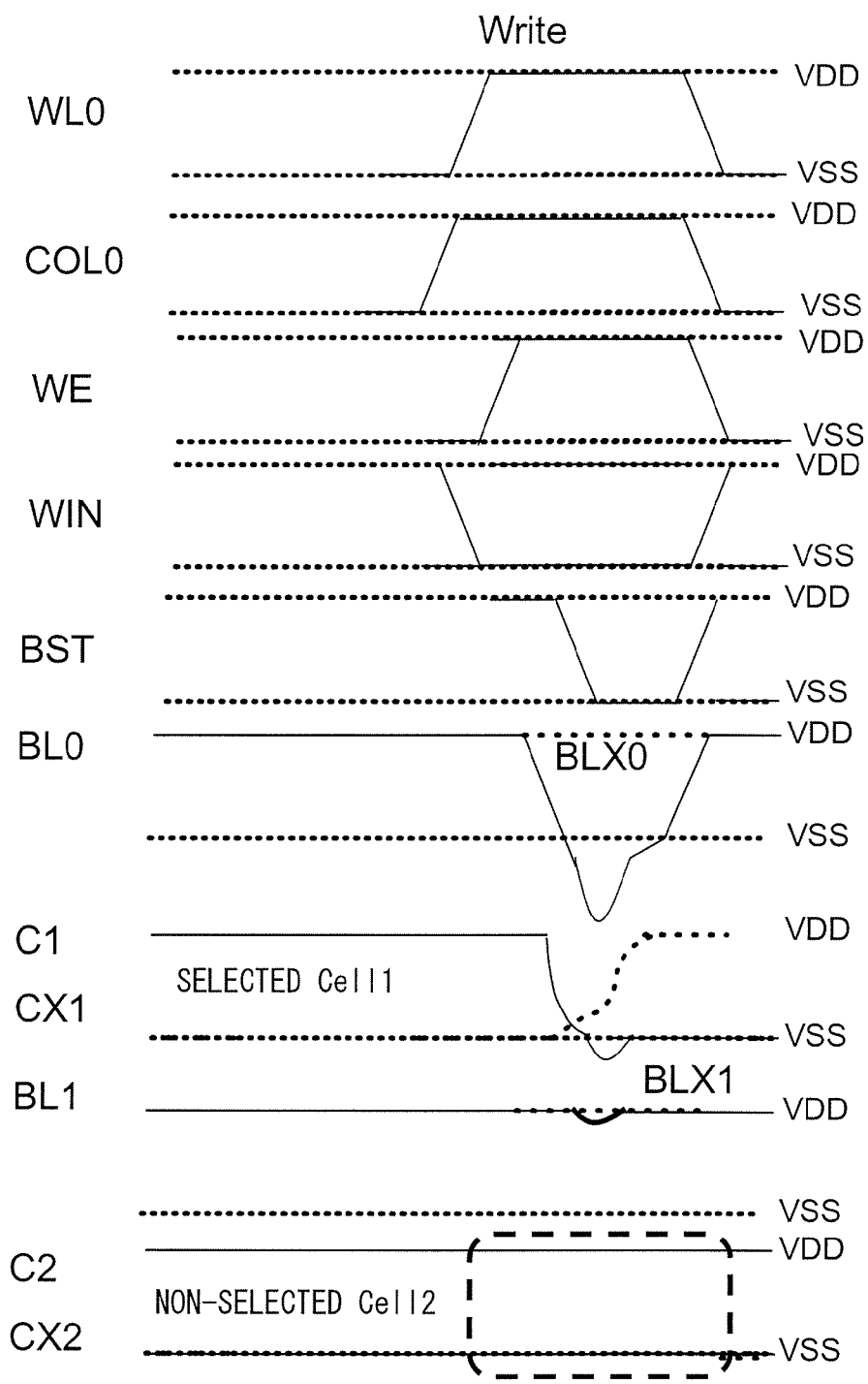
FIG. 5 is a time chart illustrating the write operation of the SRAM of the embodiment.

FIG. 5 is a time chart illustrating the write operation of the SRAM of the embodiment.

FIG. 5 illustrates an example in which the WL0 turns on, the COL0 turns on, the Cell1 is accessed, and WIN=L is written as illustrated in FIG. 1. The waveforms of WE, BST, BL0, C1 and CX1 are same as those of FIG. 2, and the explanations regarding the write operation to Cell1 is omitted.

The non-selected column signal COL1 is the L level (=VSS). As described above, although WD is boosted to NVS, the transistor t2 of the column switch maintains the off state since NVS is applied to the well of the t2 of the column switch and the reverse bias is deep. Accordingly, BL1 and BLX1 of the bit line pair are maintained at states in correspondence to data stored in Cell2. and the relationship of the nodes C2 and CX2 of Cell2 does not change.

As explained above, the SRAM of the embodiment can prevent an erroneous write to cells of the non-selected columns by a simple configuration that a well of transistors of the column switch is separated and the boosted voltage NVS is applied to the well.

Generally speaking, in the SRAM, a row decoder and a column decoder are arranged at horizontal sides of a memory cell array of a rectangular shape including a plurality of word lines, a plurality of bit line pairs and a plurality of memory cells. A read circuit and a write circuit are arranged at vertical sides of the memory cell array. The plurality of column switches are arranged in a rectangular area adjoining to the memory cell array. Accordingly, it is desired that the well(s) of transistors of the plurality of column switches are separated from wells of other transistors and connected to the drive power source line NVS of the first inverter INV and the second inverted INVX.

Further, the well of the column switch pairs (t1 and t3; t2 and t4) in correspondence to the bit line pairs may be respectively separated, and the boosted voltage NVS is applied to each of the wells only when the corresponding bit line pair is selected, namely, the corresponding column switch pair turns on. In other state in which the corresponding bit line pair is not selected, VSS is applied to the corresponding well. Due to this, it is possible to turn on the selected column switch more correctly.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A static random access memory (RAM) comprising:
   a plurality of word lines;
   a plurality of bit line pairs;
   a plurality of memory cells provided at intersections of the plurality of bit line pairs and the plurality of word lines;
   a write driver connected between a high potential power source line, whose potential is higher than a reference potential, and a drive line;
   a column switch having transistor pairs which connect one of the plurality of bit line pairs, which is selected, to the write driver; and
   a boost circuit which boosts the drive line of the write driver to a negative potential, which is a potential lower than the reference potential, at a time of writing of the memory cell, wherein a well of the transistor pairs of the column switch is an independent well which is separated from wells of other transistors, and connected to the drive line so as to prevent an erroneous write to the memory cells of non-selected columns.

2. The static RAM according to claim 1, wherein the transistor pairs of the column switch are pairs of N-channel MOS transistors.

3. A semiconductor device including a static random access memory (RAM) comprising:
- a plurality of word lines;
- a plurality of bit line pairs;
- a plurality of memory cells provided at intersections of the plurality of bit line pairs and the plurality of word lines;
- a write driver connected between a high potential power source line, of which potential is higher than a reference potential, and a drive line;
- a column switch having transistor pairs which connect one of the plurality of bit line pairs, which is selected, to the write driver; and
- a boost circuit which boosts the drive line of the write driver to a negative potential, which is a potential lower than the reference potential, at a time of writing of the memory cell, wherein a well of the transistor pairs of the column switch is an independent well which is separated from wells of other transistors, and connected to the drive line so as to prevent an erroneous write to the memory cells of non-selected columns.

* * * * *